United States Patent [19]
Bourdead'hui et al.

[11] Patent Number: 5,995,719
[45] Date of Patent: Nov. 30, 1999

[54] METHOD FOR PROOFING IMPOSED DOCUMENTS

[75] Inventors: Antoine Bourdead'hui, Zwalm; Johan Rommelaere, Heverlee; Freddy Pieters, Ghent, all of Belgium

[73] Assignee: Barco Graphics NV, Ghent, Belgium

[21] Appl. No.: 08/823,822

[22] Filed: Mar. 25, 1997

[51] Int. Cl.$^6$ .............. B41B 15/00; G06K 9/00; H04N 1/46
[52] U.S. Cl. .............. 395/111; 395/111; 395/115; 395/114; 395/116; 382/112; 358/515
[58] Field of Search .................. 395/114, 115, 395/116; 364/514; 382/112; 358/515

[56] References Cited

U.S. PATENT DOCUMENTS

| | | | |
|---|---|---|---|
| 5,319,470 | 6/1994 | Shukunami | 354/451 |
| 5,604,579 | 2/1997 | Kushida | 355/400 |
| 5,652,711 | 7/1997 | Vennekens | 395/116 |
| 5,724,437 | 3/1998 | Bucher et al. | 382/112 |
| 5,810,494 | 9/1996 | Memard et al. | 400/634 |

FOREIGN PATENT DOCUMENTS

| | | | |
|---|---|---|---|
| 0 105 468 | 4/1984 | European Pat. Off. | B41F 33/00 |
| 0105468 | 4/1984 | European Pat. Off. | B41F 33/00 |
| 0557008 | 8/1993 | European Pat. Off. | G06F 15/72 |
| 0643330 | 3/1995 | European Pat. Off. | G03F 1/04 |

OTHER PUBLICATIONS

PCT search report for PCT Application No. PCT/BE98/00041 (published as part of PCT publication WO 9842509 (A1)).

*Primary Examiner*—Edward L. Coles
*Assistant Examiner*—Twyler Lamb
*Attorney, Agent, or Firm*—Inventek; Dov Rosenfeld

[57] ABSTRACT

A method of imposition proofing of printing data of a document onto a set of proof sheets is described, the document having one or more sections, each proof sheet having a recto side and a verso side, the printing data including imposing information and printing information for positioning and printing a set of pages onto one or more print sheets, each print sheet having two print sheet sides, a verso print sheet side and a recto print sheet side, each print sheet side having at least four pages. The method includes, for each print sheet in the printing data, dividing the pages imposed on each side of the print sheet into printer spreads of two pages, and determining information referencing the printing data, for defining how each printer spread is printed on each side of a proof sheet.

50 Claims, 11 Drawing Sheets

METHOD FOR PROOFING IMPOSED DOCUMENTS

BACKGROUND OF THE INVENTION

1. Field of the Invention

This invention relates to preparing documents for printing. In particular, this invention relates to a method for proofing imposed documents, for example books, magazines and brochures, on a proofing medium.

2. Description of the Prior Art

Generally, modern production techniques for documents such as books, magazines and brochures, can be split into three major stages:

1. Prepress. In the prepress stage of production, media are prepared for a printing device. The output of this stage is an imaged film, plate, cylinder or, in the case of digital printing presses, digital data. One of the steps in the prepress stage is imposition. This step ensures that each page of the document is placed on the proper printing sheet in the correct orientation.
2. Printing. During this stage of production the information produced by the prepress system is duplicated on sheets of output medium using a press, a digital printing system, or some other duplicator of printed material.
3. Finishing. In this stage the printed sheets of output medium are folded, assembled and cut to form the final documents.

Since stages 2 and 3 generally are used for high volume work, the fixed cost of stage 1 and the set up of printing and finishing is very high compared to the variable marginal cost of printing one document. Errors discovered only in the printing or finishing stages tend to be very expensive. Professional printers thus want to see a simulation of the result of stages 2 and 3 before actually performing these processes. They also need to be able to provide proofs that give customers a clear impression of how the actual printed document will look.

Imposition usually is carried out on a computer, using an imposition software program which takes the individual pages of a document and lays the pages out on large sheets ("print sheets"), several pages to a sheet, so that after printing, the print sheets can be folded and cut to generate one or more subsets ("sections") of the document which are then combined to form a complete document. Typical prior art imposition programs generate printing data comprising at least one computer file containing information about the position of the pages on sheets of output medium ("print sheets") as well as the content of these pages. Typically, the printing data might contain references to other files which describe the contents of the individual pages, such other files including, for example, line art images, continuous tone images, text, fonts, etc. Each print sheet includes a recto side and a verso side. At least four pages are imposed on a single side of a print sheet, and some of these pages may be blank.

It should be noted that the words impositioning and impositioned are sometimes used for the words imposing and imposed, respectively.

Up to now, different proofing methods have been used to produce proofs of imposed documents from printing data produced by an imposition program. Known proofing methods produce flats, large sheets containing images for at least four pages in the resulting document. These flats have to be folded in a specific way, possibly after being combined with one or more other flats, and then cut to obtain a simulation of the document to be printed. Folding and cutting the flats is a very labor-intensive process.

Blueprint proofing methods start with film and make one copy of a printed sheet by a photo chemical process. The primary disadvantage of these methods is that they are expensive in consumption of consumables, due to the special paper and chemical products used. Additionally, in these methods, normally only one or two separations are transferred to the paper. By consequence, the resulting proofs cannot be used as a content proof for pages containing more than two separations, for example in four-color printing. Furthermore, these methods can only be used where film is the output of the prepress stage. Nowadays, the printing industry is shifting more and more towards computer-to-plate production, in which film is no longer used, and thus blueprint proofing can no longer be used.

Another prior art proofing method is the use of a short run proofing press. This is a small press which has a lower start up cost than a full scale printing press, the press on which the real printing stage of the document takes place. The proofing press is used to print only a small amount of examples. The same plates are used in the proofing press that are used on the printing press and therefore this method has the disadvantage that the format of the proofing press must be at least the format of the printing press. Furthermore, although smaller costs are to be foreseen for starting up a short run proofing press, a high initial investment is needed for such a press.

A third proofing method involves page proofing and imposition proofing separately. In this method the pages are proofed unscaled on an electronic proofing device. Then the imposed sheets are downscaled to form a "mechanical" proof which shows whether pages are aligned correctly. The imposition proof has to be folded and cut, which again is labor-intensive, although a larger proofer can produce larger imposed sheets that do not require downscaling. The two main disadvantages of this method is that two proofs must be made and checked separately and that a physical model of the document as it will be printed eventually is not available to show to the customer.

Thus, there is a need in the art for a method of simulating on a proofing medium the printed results of printing an imposed document, the method avoiding folding and cutting.

One of the problems of proofing is that there is a chance that the printed proof will not be printed with the same data (photographs, text, etc.) as the final printing output. This can come about, for example, by some of the images used being modified during the time between proofing and final printing. Thus there is a need in the art for mechanisms that aid checking for correct placement and for version control in proofing.

SUMMARY OF THE INVENTION

Objects of the Invention

It is an object of the present invention to provide a method and an apparatus for simulating on a proofing medium the results of printing an imposed document, the imposed document generated, for example, by an imposing, so that the sheets of proofing medium no longer require a labor-intensive cutting step.

This simulation generates through a digital proofer the same type of recto/verso printer spread sheets one can get by disassembling the eventually finished document. These printer spreads from the proof printer can easily be collated in the same way the real document will be after cutting, and thus simulate the printing and assembling of the document.

It is a further object of the present invention to provide a method and an apparatus for including marks in the proof of the results of printing an imposed document, the marks providing an aid for checking for correct placement and for version control Overview of the Invention In accordance with the present invention, a method is disclosed for imposition proofing of pages on sheets of proofing medium ("proof sheets"). The method described starts from printing data produced by an imposition program, this printing data containing information about the position of the pages on sheets of output medium ("print sheets") as well as information about the content of these pages. A "page" so defined therefore may be a blank page. Each print sheet has a recto side and a verso side. The pages imposed on each side of a print sheet are divided in sets of two pages ("printer spreads"), and one or more of these pages may be blank. The document consists of sections, and each section has at least four pages. The number of sections in the document and the number of pages per section in the document are provided by the user. The method produces proofer data for printing sides of proof sheets, each proof sheet having two sides, a recto side and a verso side. The proofer data states how each printer spread (set of two pages) is printed on each side of a proof sheet, as well as the order of arranging the proof sheets.

According to one preferred embodiment, a method for imposition proofing is disclosed which includes selecting from printing data those pages positioned before the middle of each section. The method includes positioning on a side of a proof page each selected page together with its partner page in its print spread, and outputting that positioning information as part of the proofer data. The method also includes determining the logical place (the order) for the proof page side containing the selected page, including whether that page is printed on a recto or verso side of the proofer data, and outputting the ordering information as part of the proofer data.

According to an improved embodiment of the present invention, the method also includes adding one or more extra marks to the proofer data, these extra marks determined from the printing data to aid checking for correct placement and for version control. According to one embodiment, these extra marks are one or more of: the name of the page, the date of proofing, a rectangle around the unfinished format, a rectangle around the finished format, and a rectangle around the text area of the page. According to another embodiment, an extra mark is added to the proofer data comprising a number (herein called a "magic number") which is a function of the images, pages and sheets actually used to make the proof. A number then can also be added to the printing data which is a function of the images, pages and sheets actually used to make to output the printing data in preparing the film or plate. The function is chosen so that if the magic number on the film or plate is the same as on the proof, there is an extremely high likelihood that these were made using the same data, and if the magic number on the film or plate does not match that on the proof, then there is certainty that the data used to proof is different from that used to prepare final output.

An apparatus for imposition proofing also is disclosed, taking as input printing data and outputting proofer data. The apparatus includes means for selecting from the printing data those pages positioned before the middle of each section. The apparatus also includes positioning means coupled to the selecting means, for positioning the selected pages together with their partner pages on a side (recto or verso) of a proof page, and outputting that positioning information as part of the proofer data. The apparatus also includes order determining means coupled to the selecting means, for determining the logical place (the order as ordering information) for the proof page side containing the selected page, such ordering information including whether a page is to be printed on the verso side or recto side of the proof pages, and outputting the ordering information as part of the proofer data. According to a preferred embodiment of the present invention, the apparatus also includes marking means coupled to the selecting means, for adding extra marks to the proofer data, these extra marks determined from the printing data to aid checking for correct placement and for version control.

BRIEF DESCRIPTION OF THE DRAWINGS

The present invention will be understood and appreciated more fully from the following detailed description taken together with the drawings and annexes in which.

DESCRIPTION OF THE PREFERRED EMBODIMENT

A preferred embodiment of the present invention is a method implemented on a computer. The steps of the method are performed by the computer executing a software program.

Figure 1:
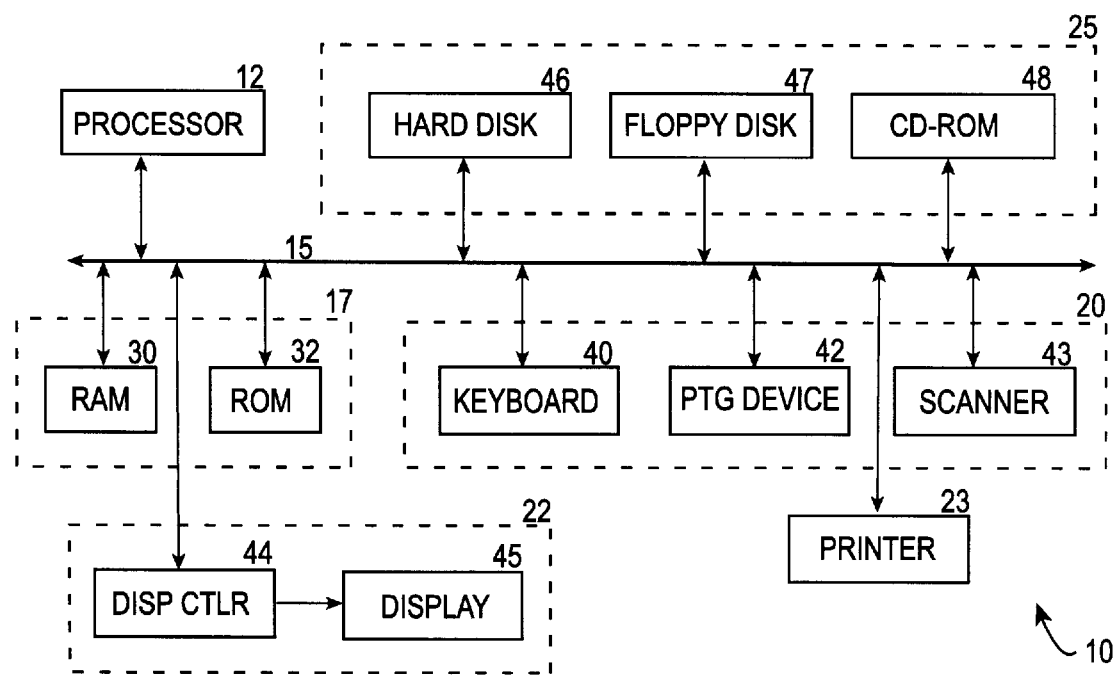
FIG. 1 is a block diagram of a typical computer system (Prior Art) in which the present invention may be embodied.

FIG. 1 is a simplified block diagram of a computer system 10 in which the present invention may be embodied. The computer system configuration illustrated at this high level is standard, and as such, FIG. 1 is labeled "PRIOR ART." A computer system such as system 10, suitably programmed to embody the present invention, however, is not prior art. The specific embodiments of the invention are embodied in a general-purpose computer system such as shown in FIG. 1, and the remaining description will generally assume that environment. However, the invention may be embodied in dedicated devices such as printer servers, and printer controllers.

In accordance with known practice, the computer system includes a processor 12 that communicates with a number of peripheral devices via a bus subsystem 15. These peripheral devices typically include a memory subsystem 17, a user input facility 20, a display subsystem 22, output devices such as a printer 23, and a file storage system 25.

In this context, the term "bus subsystem" is used generically so as to include any mechanism for letting the various components of the system communicate with each other as intended. With the exception of the input devices and the display, the other components need not be at the same physical location. Thus, for example, portions of the file storage system could be connected via various local-area or wide-area network media, including telephone lines. Similarly, the input devices and display need not be at the same location as the processor, although it is anticipated that the present invention will most often be implemented in the context of personal computers ("PCs") and workstations.

Bus subsystem 15 is shown schematically as a single bus, but a typical system has a number of buses such as a local bus and one or more expansion buses (e.g., ADB, SCSI, ISA, EISA, MCA, NuBus, or PCI), as well as serial and parallel ports. Network connections are usually established through a device such as a network adapter on one of these expansion buses or a modem on a serial port. The computer system may be a desktop system or a portable system or an embedded controller.

Memory subsystem 17 includes a number of memories including a main random access memory ("RAM") 30 and a read only memory ("ROM") 32 in which fixed instructions are stored. In the case of Macintosh-compatible personal computers this would include portions of the operating system; in the case of IBM-compatible personal computers, this would include the BIOS ("basic input/output system").

User input facility 20 typically includes a keyboard 40 and may further include a pointing device 42 and a scanner 43. The pointing device may be an indirect pointing device such as a mouse, trackball, touchpad, or graphics tablet, or a direct pointing device such as a touchscreen incorporated into the display.

Display subsystem 22 typically includes a display controller 44 and a display device 45 coupled to the controller. The display device may be a cathode ray tube ("CRT"), a flat-panel device such as a liquid crystal display ("LCD"), or a projection device. Display controller provides control signals to the display device and normally includes a display memory (not shown in the figure) for storing the pixels that appear on the display device.

The file storage system provides persistent (non-volatile) storage for program and data files, and typically includes at least one hard disk drive 46 and at least one floppy disk drive 47. There may also be other devices such as a CD-ROM drive 48 and optical drives. Additionally, the system may include hard drives of the type with removable media cartridges. As noted above, one or more of the drives may be located at a remote location, such as in a server on a local area network or at a site on the Internet's World Wide Web.

In the preferred embodiment, the proofing medium is smaller than the actual output medium. The invention covers also the general case. The proofing medium has two pages per side, while the output medium comprises sheets (print sheets) of at least four pages per side, some of these pages possibly being blank. The method described starts from final printing data produced by an imposition program, this final printing data being at least one file containing information about the position of the pages on the print sheets of output medium as well as the content of these pages. Each print sheet has a recto side and a verso side.

The method of the present invention produces data for generating proof sheets, typically but not necessarily on a digital proofer. The pages imposed on each side of a print sheet are divided by the method of the present invention into proof exposures of two pages each, one or more of which may be a blank page. Each proof exposure of two pages is eventually printed on one side of a proof sheet. With two sided printing, each proof sheet thus consists of two parts, a recto part and a verso part, each part corresponding to two pages in the document. The different proof sheets are folded once and collated so as to form at least one section, where section means the parts of an eventual document as they are after insertion but before they are bound together. The place where each proof sheet is folded forms the spine of the section. If more than one section has been formed, then the sections need not be stacked together in the right order to form the simulated book. The sections are such that they represent the sections of the final document, enabling the one to check size, position, and other imposition qualities.

In the preferred embodiment of the method of the present invention, at least one proofer output file is generated from the printing data generated by the imposition program. The proofer data, in the form of proofer output file (or files) contains information about which pages from the printing data will have to be printed on each proof sheet and in which way. The printing data, later used to generate the final imposition output (film or plate), is used by the method of the present invention for the proof, but remains untouched. No new data is generated to form the proofer data; rather, references to the printing data file are assembled. Alternate implementations of the invention may generate separate proofer data and printing data files, the proofer data containing new data.

When proofer data, typically proofer output files, are sent to a digital proofer, the proofer output files are printed on the proofing medium by means of the digital proofer. In this way the different proof sheets are generated. A duplex proofing medium (that is, automatic two-sided printing) provides the optimal case, although the preferred embodiment can easily be modified to work well with a proofing device that does not do automatic two-sided printing. How to carry out such a modification would be clear to those of ordinary skill in the art.

Figure 2:
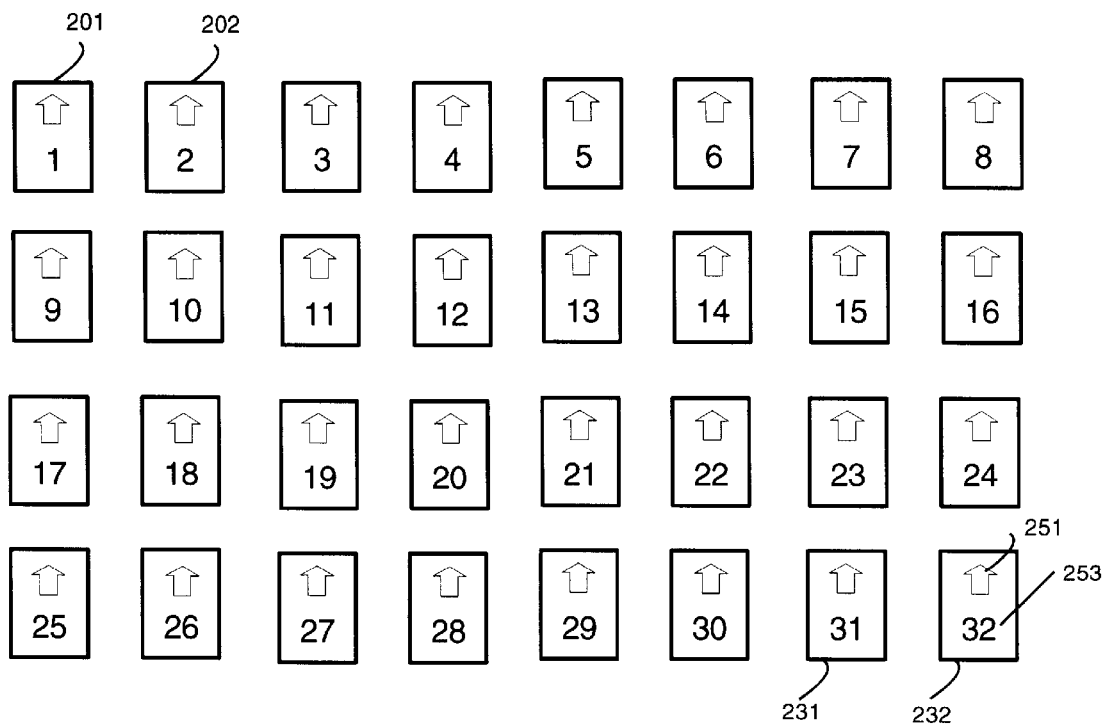
FIG. 2 shows 32 pages of a sample magazine as they come into an imposition program (Prior Art)

By way of example, the method of the present invention will be described for proofing a sample magazine containing thirty-two pages, as shown in FIG. 2. Each page is shown as a rectangle. Page 1 is denoted 201, page 2 is denoted 202, . . . , page 31 is denoted 231; and page 32 is denoted 232, respectively. The page number is shown in each rectangle in FIG. 2. See for example the "32" (denoted 253) on page 32 (denoted 232). The white arrow on each page points in the upward direction of that page, for example, the arrow 251 on page 32. The final produced magazine of this example consists of two sections, each containing sixteen pages. A section typically consists of a number of print sheets folded together and forming part of the magazine. Although in the example, all the sections have the same number of pages, the invention works equally with documents that have sections of an unequal number of pages.

Figure 3:
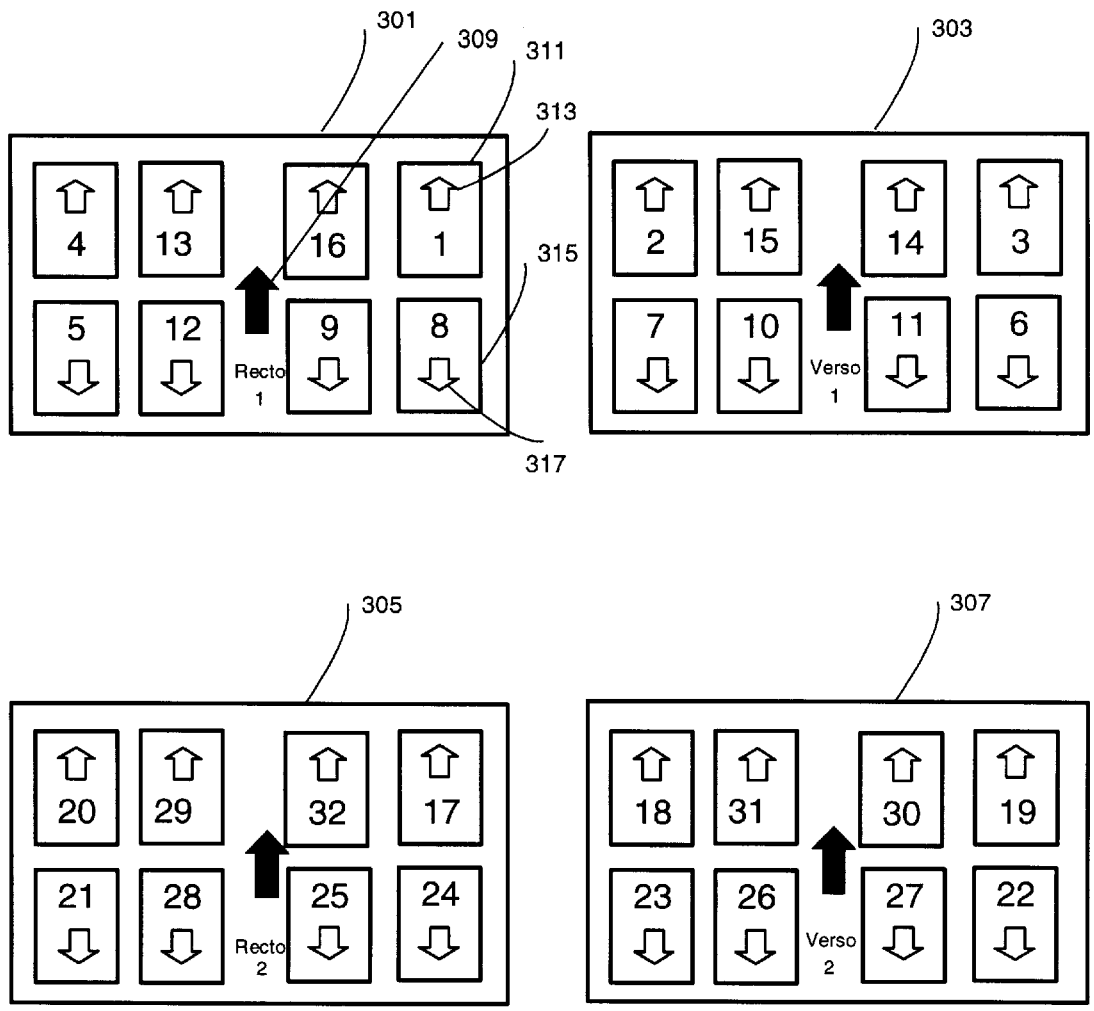
FIG. 3 shows the 32 pages as they might come out of a typical imposition program (Prior Art) in a possible 8-up case used herein as an example.

In a typical computer program for imposing, for example, the Impose!™ program from Barco Graphics, the assignee of the present invention, for the sample magazine, each of the thirty-two pages comes into the program in ascending order, and is imposed by the program on sides of print sheets. The output of the imposition program is the printing data, and includes references to all the data which needs to be printed, for example, references to the data files containing the images, text, fonts, etc. Print sheets are large sheets of output medium used for printing a document. For a typical document, the print sheets may be printed on both sides. For the example, assuming eight pages can go on one side of a print sheet, then the whole of the sample magazine to be printed would typically be imposed on the four sides of two print sheets as shown in FIG. 3 and numbered 1 and 2, respectively, with "Recto 1" and "Verso 1" being the recto and verso sides, respectively, of sheet 1, and "Recto 2" and "Verso 2" being the recto and verso sides, respectively, of sheet 2. The imposition program causes some of the pages to be turned upside down, as shown by some of the white arrows pointing down in FIG. 3. This is in order to enable these pages to be in the correct position when the print sheets are folded. For example, on the print sheet side denoted 301, (the recto side of print sheet 1), page 8 (item 315) needs to be printed upside down as indicated by white arrow 317 pointing down, while page 1 (item 311) is printed on that side 301 right side up. Such imposing of pages on sides of print sheets is known in the prior art.

The black arrows, represented on each side of a print sheet in FIG. 3, for example, arrow 309 on side 301, point to the upward direction of that print sheet. Verso 1 (the verso side of the print sheet 1 is labeled 303) while Recto 1 (the recto part of that print sheet) is denoted in FIG. 3 by 301. The Verso 2 is denoted 307 while Recto 2 is denoted in FIG. 3 by 305. When printed in this manner, folded and cut, the first print sheet (sides 301 and 303) forms the first section of the magazine, while the second print sheet (sides 305 and 307) forms the second section. The first and the second sections are then bound together to form the actual magazine.

The imposition program outputs printing data for printing print sheets 1 and 2 of sides 301, 303, 305, and 307 according to the data shown in the example of FIG. 3. The data of the pages of the document may be in black and white or in color, may contain images, the images may be line art images, continuous tone images, or both. Thus the printing data may include data for a single monochrome print, or may include color separations, or other forms of data needed to print the print sheets. The printing data may be used to generate film for producing plates, or may go directly to a platemaker, or may go directly to a direct digital print engine. The method of the present invention is applicable to all such situations.

The printing data produced by Impose!, the imposition program used in the preferred embodiment, includes two formats, called the "unfinished format" and the "finished format," respectively. The unfinished format includes page windows (clipping masks for viewing pages in the print) that are slightly larger, typically by a few millimeters, than the page windows for the finished format. The unfinished format is the format to which the final print sheet is folded, the finished format is the format to which the book is trimmed. The preferred embodiment of the present invention uses the unfinished format for imposition proofing, and this enables a person reading the proof to see more than would be visible if the finished format was used, and thus enable such a person to make adjustments based on such a proof.

According to the preferred embodiment of the method of the present invention, two pages forming a set (a "printer spread") are printed next to each other on one side of a proof sheet which has at least the same height as and twice the width of the unfinished format of the resulting magazine. In an alternate embodiment, if the proof sheets are smaller, the data may be downscaled in order to fit in two pages on one proof sheet side so that in any case, each printed side of a proof sheet contains two pages. Thus, piles of proof sheets can be folded in two. By collating all these folded piles of proof sheets together, they will form the same sections as are formed in the real job after folding and inserting, but before binding and trimming. Trimming means the cutting of one or more sections in one cut. The proofed document, on the other hand, does not require trimming to be readable, since the pages are only connected over the spine.

Figure 8:
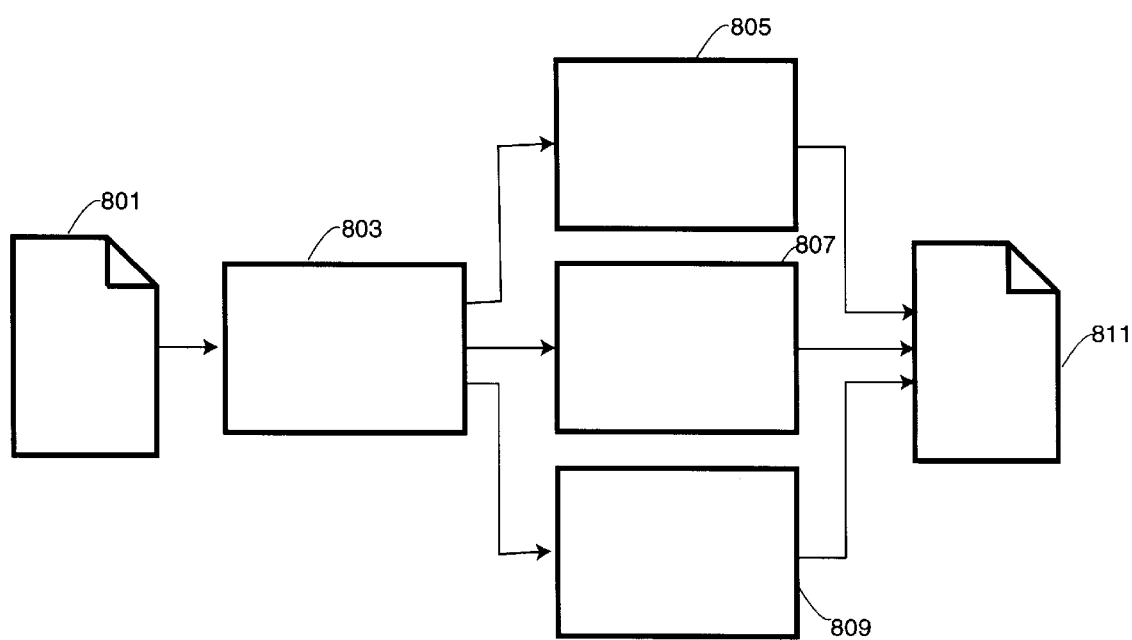
FIG. 8 shows an overview of the method of the present invention.

The preferred embodiment of the imposition proofing method of the present invention is shown in FIG. 8. The printing data 801, generated by the imposition program and comprising data as to how the pages of the magazine are imposed in the imposed print sheets, is used by the method to form additional output, the proofer data 811, in the form of one or more proofer output files which comprise electronic data to be sent to the proofer containing instructions to print the pages in another sequence than specified in printing data 801. In the general case, variable nsheets is the number of print sheets that are in printing data 801 as determined in the imposition program, each print sheet having a recto and a verso side, each of the two sides of sheet k, $1 \leq k \leq nsheets$, containing $ncolumns_k$ columns and $nrows_k$ rows, $ncolumns_k$ and $nrows_k$ determined again by the imposition program. If ntotal is the number of pages of the output document, nproofsides, the number of sides of proof sheets in the proofer data 811 that the proofer eventually will have to print is ntotal divided by two, as two pages will be printed on each side of a proof sheet. Some pages may be blank. The number of sections in the magazine is nsections. In the example, each sheet contains only one section, so nsheets=nsections. Denoting the number of pages in each section j by $nsectionpages_j$, $1 \leq j \leq nsections$, for the sample magazine, $nsectionpages_j = 2*ncolumns_j*nrows_j$. In the general case, there can be multiple sections on one sheet or one section on multiple sheets, so that nsheets≠nsections. In the general case, the value of $nsectionpages_j$, for each section is defined by the user. Note that $$ntotal = \sum_{j=1}^{nsections} nsectionpages_j.$$

For the sample magazine, there are two print sheets, each corresponding to one section (nsheets=nsections=2), each sheet having a recto and a verso side, each side containing four columns ($ncolumns_k=4$, k=1,2) and two rows ($nrows_k=2$, k=1,2) of pages. Thus, $nsectionpages_j=16$, j=1,2, and ntotal=32. The method includes step 803 for selecting from printing data 801 those pages positioned before the middle of each section. For the present example, selecting step 803 selects pages 1 through 8 from the first section and pages 17 through 24 from the second section. Equivalently, one may implement the method of the present invention by choosing those pages positioned after the middle of each section, and alternate embodiments may use the alternately selected pages.

The selected pages are positioned together with their partner pages in step 805 on a side of a proof page. In addition, the logical place (the order) for that proof page side is determined in step 807. According to a preferred embodiment of the present invention, extra marks are added in step 809 to the proofer data 811. These extra marks are to aid checking for correct placement and for version control.

In the preferred embodiment, steps 803, 805, 807 and 809 are implemented in the form of computer program instructions which operate on computer system 10. These computer program instructions are incorporated into the main imposition program, although clearly alternate implementations are possible with the proofing method of the present invention running as a separate program from the main imposition program. Printing data 801 and proofer data 811 are data files in file storage system 25.

Figure 6:
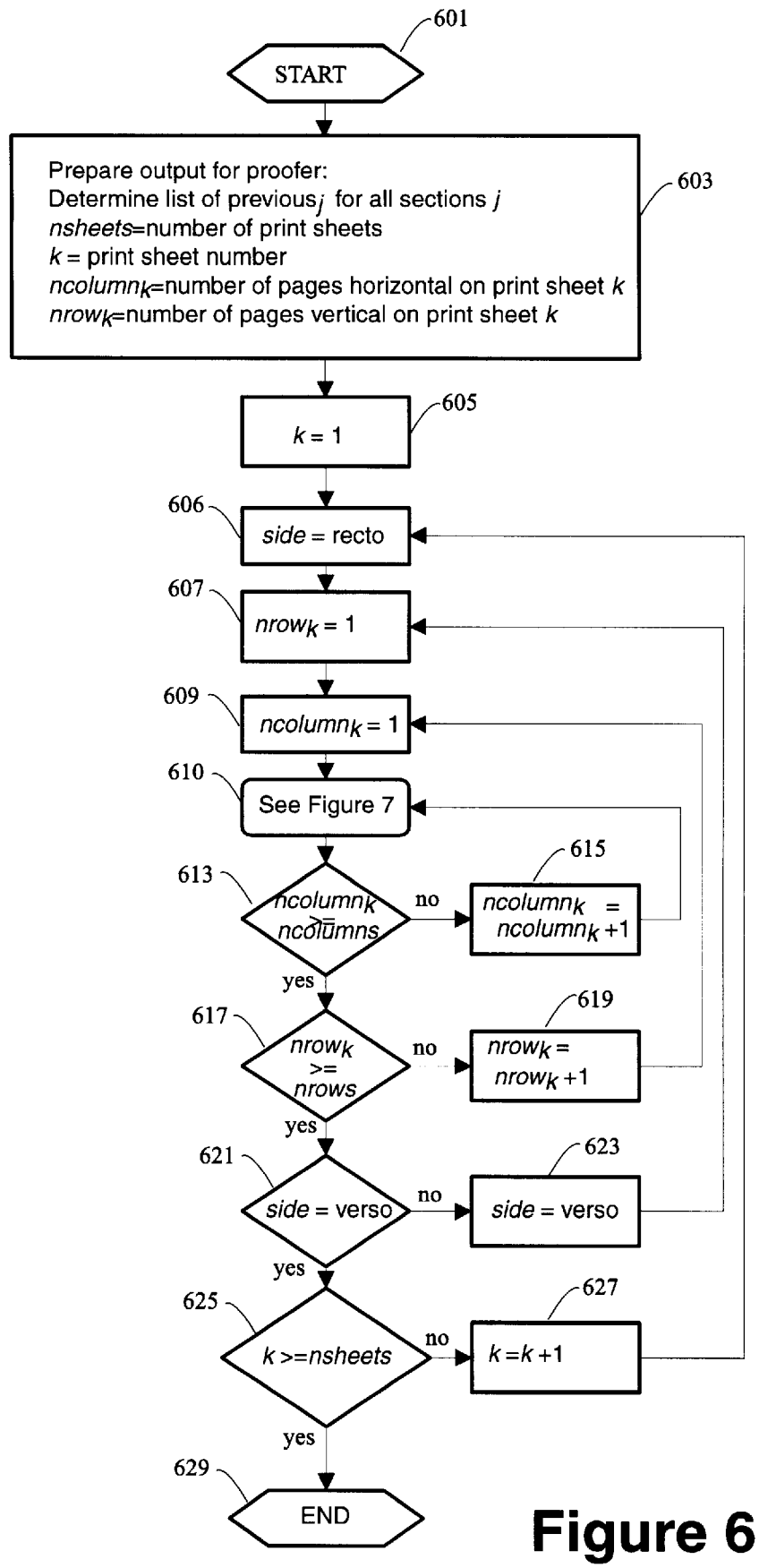
FIG. 6 shows a flow chart producing proofer data according to the method of the present invention.
Figure 7:
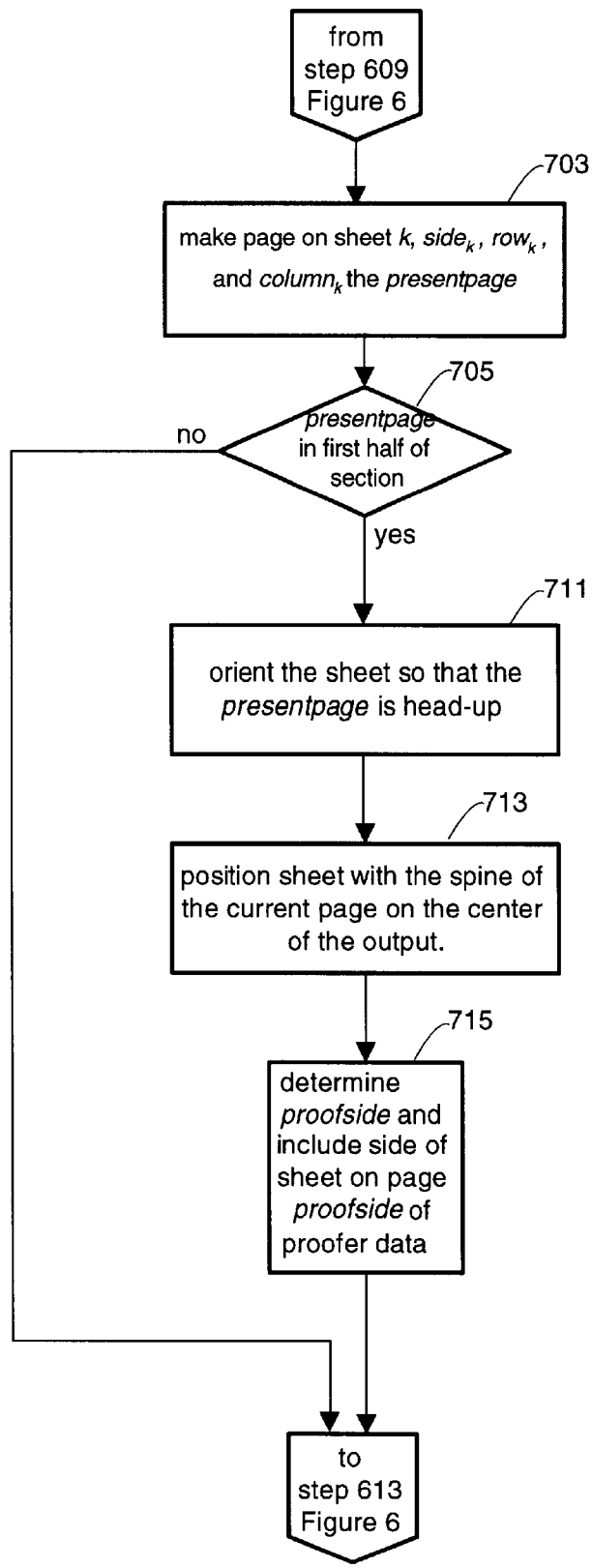
FIG. 7 shows part of the flow chart of FIG. 6 in more detail.

The preferred embodiment of the method for doing this is now explained with the aid of the flow charts of FIG. 6 and FIG. 7. Selecting step 803 looks at one page at a time from printing data 801. The following relationships are first defined. Denoting the page number encountered at any time by presentpage, the current section being processed by j, j=1, . . . , nsections, the number of pages in all previous sections by nprevious$_j$, j=1, . . . , nsections, and the page number within the current section as current$_j$, then $$nprevious_j = 0, \quad j = 1$$

$$nprevious_j = \sum_{m=1}^{j-1} nsectionpages_m, \quad j = 2, \ldots, nsections, \text{ and}$$

$$current_j = presentpage - nprevious_j, \quad j = 1, \ldots, nsheets.$$

In the preferred embodiment, the particular section being processed at any time is not explicitly stored. Rather, initially, a list of "thresholds" is built from the definition of the complete document input by the user. The threshold list contains, in order, nsectionpages$_j$, the number of pages in all sections prior to current sectionj. The list preferably is built by adding nsectionpages$_j$ to the previous entry in the list. That is, the list is built by:

$$nprevious_1 = 0;$$

for $j = 2$ to nsections do $$nprevious_j = nprevious_{j-1} + nsectionpages_j$$

endfor;

The list thus contains (nprevious$_1$, nprevious$_2$, . . . , nprevious$_{nsections}$). For example, for a publication which has three sections of 16, 8, and 4 pages, respectively, the threshold list will be (0, 16, 24). For the sample magazine, the threshold list is (0, 16, 32).

The above description is for sections that are collated; that is, sections that come in order. It is also possible to have sections that are not in order, and sections that are inserted inside each other. In the preferred embodiment, each section that contains one or more other sections is considered a single section with the value of nsectionpages for that section being the sum of nsectionpages for that section and all enclosed sections.

Pages selecting step 803 looks at page presentpage, one at a time, and selects those pages which will be in the first half of the current sectionj in the final document. That is, pages for which $1 \leq current_j < nsectionpages_j/2$. The section number j is not explicitly determined. Rather, the value in the threshold list which is the largest number less than or equal to presentpage is determined. This number is nsectionpages$_j$ for current section j. This then allows one to determine current$_j$(current$_j$=presentpage−nprevious$_j$), nsectionpages$_j$, and whether or not $1 \leq current_j < nsectionpages_j/2$. Note that of these selected pages, the odd numbered pages will print on the recto sides of the proof pages, oriented to the right of the center (the "spine"), and the even pages will print on the verso sides of the proof pages to the left of the spine. For pages that that are in the second half of each section, that is, for pages that satisfy nsectionpages$_j$/2<current$_j \leq$nsectionpages$_j$, the opposite is true: odd pages will print on the verso sides of the proof pages and the even pages will print on the recto sides.

In addition to the method which includes determining the quantity current$_j$ as described above, there are many ways within the scope of the present invention of selecting those pages that are in the first half of any section. In addition, the invention can also be implemented by selecting pages that are in the second half of any section.

Figure 9:
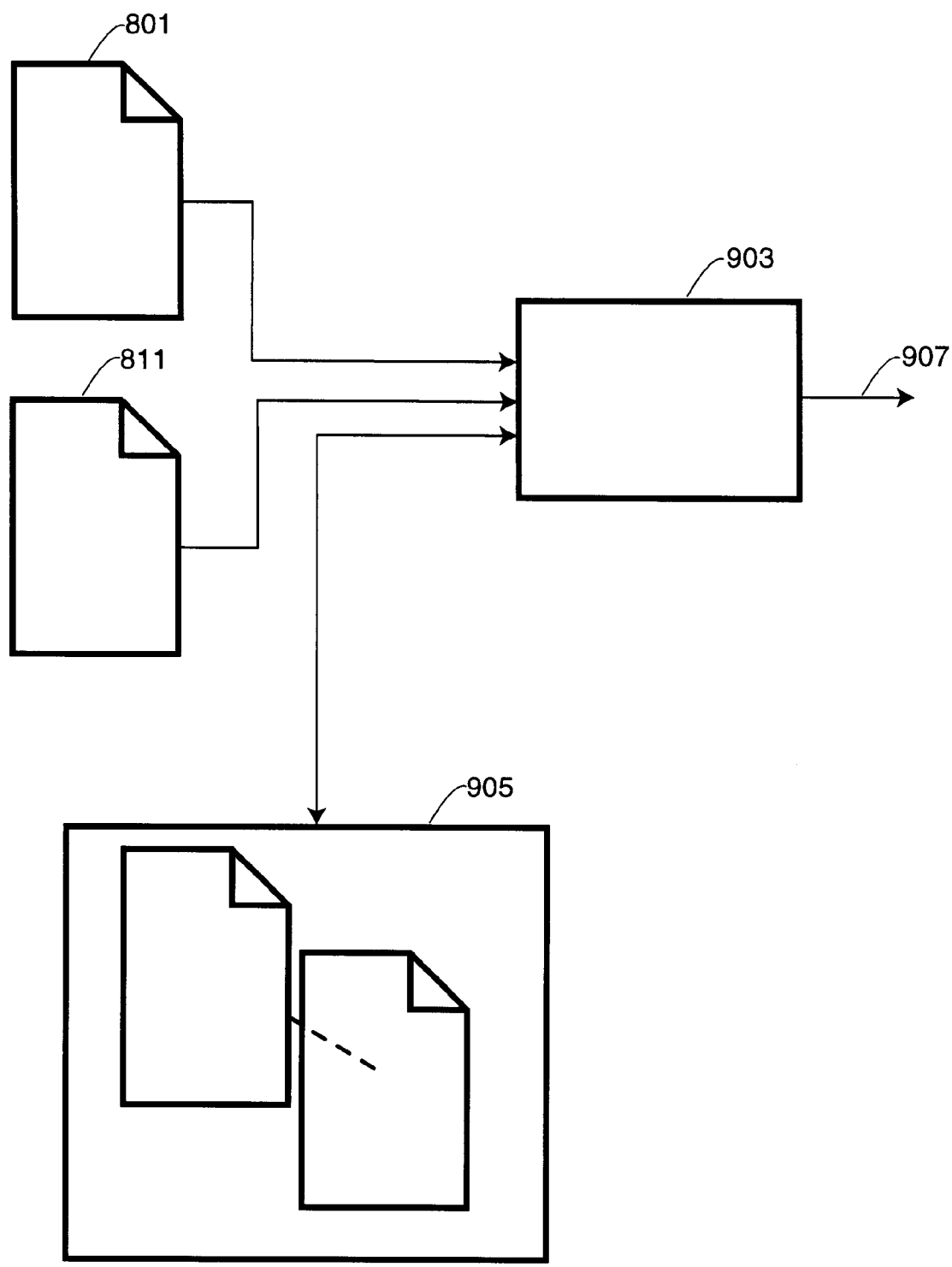
FIG. 9 shows the preferred embodiment of using the method of the present invention.

The pages in the printing data are not encountered in a sequential order by selecting step 803. When any of these pre-middle of the section pages is found, a reference is made in the proofer data 811 to the printing data 801, in particular to the side of the print sheet on which the page is found. When proofing, the controller of the proofing device, typically, the proofer raster image processor ("RIP") in the proofer, replaces the reference with the actual information contained in printing data 801. This is shown in FIG. 9, where proofer RIP 903 uses as input proofer data 811 which includes references to the printing data 801. RIP 903 takes from printing data 801 references to the actual data of each page to be output, this data being image files, text files, etc., and shown as item 905 in FIG. 9. Making a reference to printing data 801 rather than copying the real content to the proofer data 811 makes this implementation of the method of the present invention fast and compact. It also makes it easy to keep the proof sheet up-to-date with the print sheet. More importantly, this method guarantees that the proof is made with data from the same file eventually used for making the imposed film or plate. This makes the proof consistent with the final film or plate, as long, of course, as no data is changed between RIPing for proofing and RIPing for printing.

The flow chart of FIG. 6 shows how every page in the imposed printing data 801 is examined for selection in selecting step 803. Step 603 is an initialization step, and includes determining the threshold list (nprevious$_1$, nprevious$_2$, . . . , nprevious$_{nsections}$) of the number of pages in previous sections. Step 605 initializes the loop for examining sheet by sheet, starting with sheet 1, the loop starting with step 606 and looping back with steps 625 and 627 after all the sheets have been processed. Step 606 initializes the loop for examining both sides of each sheet, starting with the recto side, the loop starting with step 607 and looping back with steps 621 and 623 after both the recto and verso sides have been processed. Step 607 initializes the loop for examining each side row by row, starting with row 1, the loop starting with step 609 and looping back with steps 617 and 619 after all the rows have been processed. Step 609 initializes the loop for examining each row column by column, starting with column 1, the loop consisting of step 610 detailed in FIG. 7, and looping back with steps 613 and 615 after all the columns of the row have been processed. Thus, step 611 processes a particular column column$_k$ ($1 \leq column_k \leq ncolumns_k$) in a particular row row$_k$ ($1 \leq row_k \leq nrows_k$) in a particular side side$_k$ (side$_k$=recto or side$_k$=verso) in a particular print sheet k ($1 \leq k \leq nsheets$) in printing data 801.

Many implementations are possible within the scope of the present invention for processing all the pages of a document. The above preferred embodiment is only one such implementation.

Figure 4A:
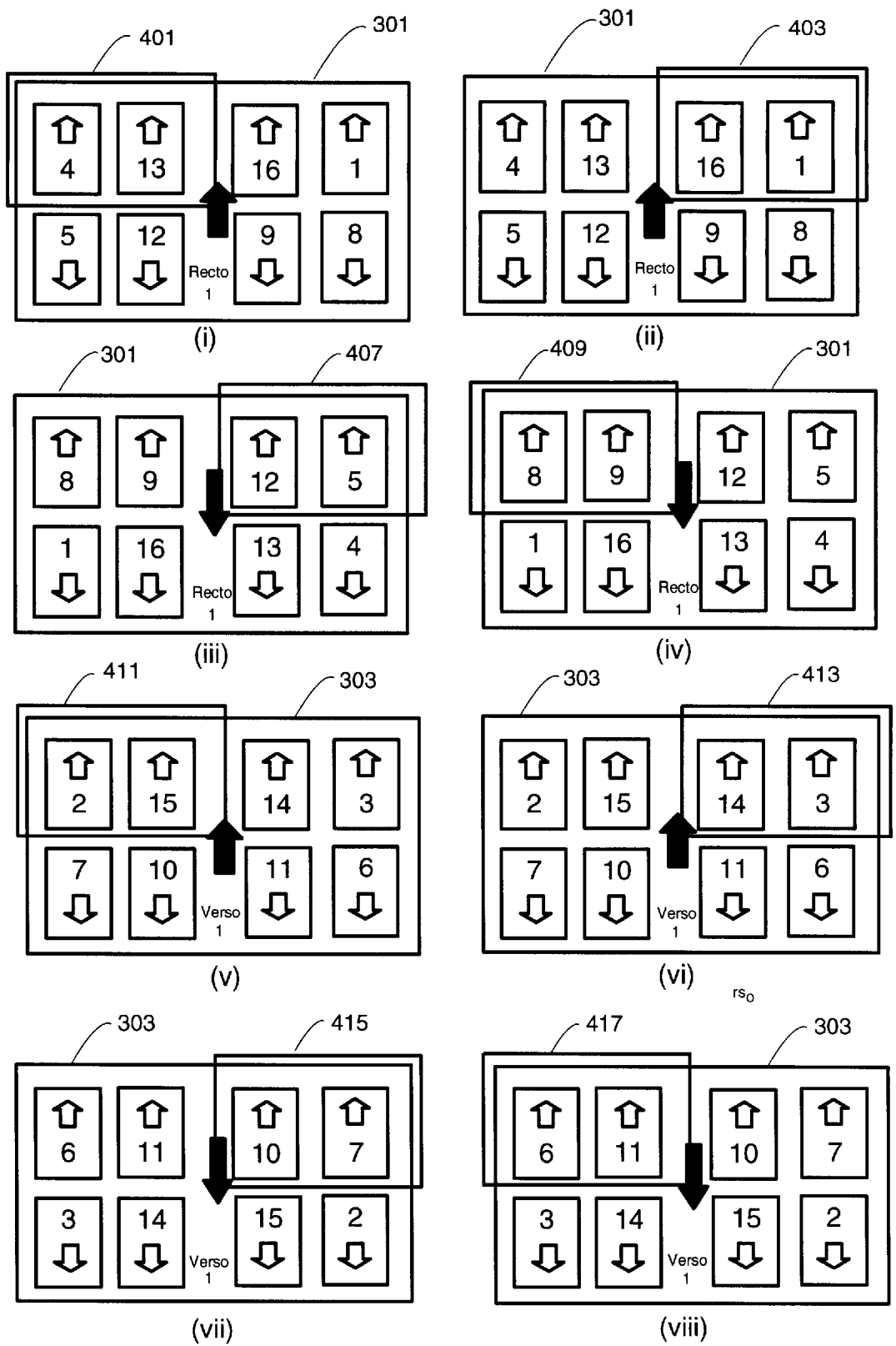
FIG. 4 (*a*) and 4 (*b*) represent, as an example, how pages coming out of an imposition program are put on proof sheets according to the method of the present invention.

FIG. 7 shows step 610 in detail. FIG. 4(a) shows the processing of the flow charts of FIG. 6 and FIG. 7 for the first section, which also is the first sheet of printing data 801 shown in FIG. 3. Initially, the present page, denoted presentpage, is the page for column$_k$=1, row$_k$=1, side$_k$=recto, and k=1. Thus, at first, presentpage=4. This situation is shown in FIG. 4(a)(i). Step 703 initializes variables, and step 705 determines whether presentpage is in the first half of the present section. This is done by looking the largest number in the list$\leq$presentpage, 0 in this case. Thus, nprevious$_j$=0, and current$_j$=presentpage−nprevious$_j$, =4. This is less than nsectionpages$_j$/2=8, so this page is selected. That is, the page is determines to be in the first half of the present section. Following the flowchart of FIG. 7, the method proceeds to step 711 to start positioning step 805. For step 711, since the sheet already is oriented so that page 4 is up, the method proceeds to 713, the second part of positioning, step 805. The print sheet is now oriented by this step 713 so that the spine (i.e., the center) of the current proof page is correctly located to the right of the page for the verso case or to the left of the page for the recto case, midway between the current page and the page located to the right (verso case) or left (recto case). In this case, the sheet 1 is moved so that the proof page has the spine midpoint between pages 4 and 13.

The side of the proof sheet on which any two pages (at first, pages 4 and 13) are positioned has a logical place number, denoted proofside, calculated in step 715, which corresponds to step 807 in FIG. 8, in the following way:

$$proofside = current_j + nprevious_j/2 = presentpage - nprevious_j/2.$$

As page 4 is the fourth page in the first section, nprevious$_j$= 0, and current$_j$=4, respectively, and the value of proofside is 4. Odd values of proofside indicate the recto side of a proof sheet, and even values of proofside indicate the verso side of a proof sheet. Thus, the first proof sheet consists of sides with proofside values 1 and 2, the second with proofside values 3 and 4, etc. Thus, the first proofer data prepared is the second (verso) side of proof sheet 2.

In the preferred embodiment, the placed proof page outline forms a clipping mask for the side of printing data 801 being examined. As described before, the printing data includes both the unfinished format and the "finished format. The preferred embodiment of the present invention uses the unfinished format for proofing. Thus, the clipping mask for the side of printing data 801 being examined is formed from unfinished format data. This is shown as item 401 in FIG. 4(a). The part of the recto side 301 of the first print sheet not within the clip mask, that is not included in the unfinished proof page, is clipped away when printing the proof pages.

The next page is now examined: the page for column$_k$=2, row$_k$=1, side$_k$=recto, and k=1. That is, now presentpage=13. This situation is shown in FIG. 4(a)(i). Page presentpage is in the second half of a section, so, it will be printed on the verso side of a proof sheet to left of the spine of the folded section. Following the flow chart of FIG. 7, this is not one of the pages that was sought in selecting step 803 and nothing is done with it.

The next page encountered is page 16. Again, this is in the second half of the section, so is not one of the pages that is sought and nothing is done with it.

The next page is page 1, which is in the first half of the section. Thus, it is one of the pages looked for. Thus the method moves to step 711 of the flow chart. Nothing is done in step 711 because the orientation is already with page 1 head up. In step 713, this page and the page that will be on the opposite side of the spine in the eventual magazine, page 16, are positioned on one side of a proof sheet so that the area between the two pages, where the spine of the section will be formed during finishing, is positioned on the center of the proof sheet. The outline of the proof sheet is shown as 403 in FIG. 4(a)(ii). The side of the proof sheet on which the pages 1 and 16 are positioned has a logical place number proofside=1, which is determined in step 715. Thus, this is the recto side of proof sheet 1.

The end of the first row of the recto side of the first print sheet has now been reached. The first page encountered in the second row is page 5. This is a page in the first half of a section, so is selected. In step 711, the recto side of the first print sheet is oriented so that page 5 is head-up. This is shown in FIG. 4(a)(iii). In step 713, this page and the page coming on the opposite side of the spine in the eventual magazine, page 12, are positioned on a side of a proof sheet so that the area between the two pages, where the spine of the section will be formed during finishing, is positioned on the center of the proof sheet. The side of the proof sheet on which the pages 5 and 12 are positioned has a logical place number 5, determined in step 715. Thus, this is the recto side of proof sheet 3.

The next two pages encountered are pages 12 and 9 which are both in the second half of the section, and thus are not processed. The next page is page 8. This is in the first half of a section, and thus a page which is selected. Here again, in step 711, the recto side of the first print sheet is oriented so that page 8 is head-up. Then, in step 713, this page and page 9, the page that will be on the opposite side of the spine in the eventual magazine, are positioned on one side of a proof sheet so that the area between the two pages where the spine of the section will be formed during finishing, is positioned in the center of the proof sheet. The a logical place number proofside for the side of the proof sheet on which pages 8 and 9 are positioned is determined to be 8 in step 715. Thus, this is the verso side of proof sheet 4.

Figure 4B:
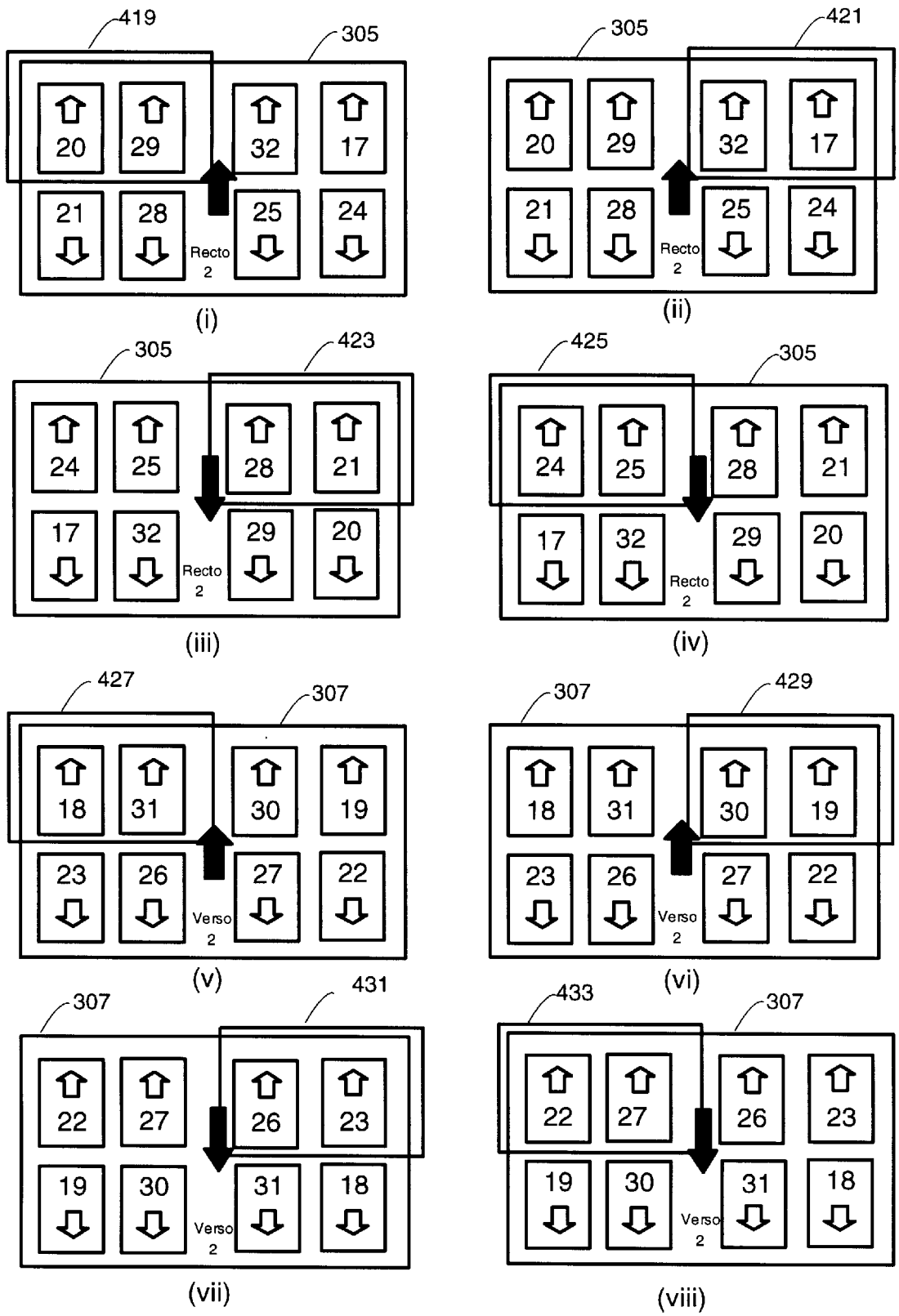

In this way each of the pages on the recto side of the first print sheet are checked. The verso side of the first print sheet and the recto and verso sides of the second print sheet are processed in the same way. FIG. 4(b) shows the processing of the second sheet of printing data 801. Thus, after each and every side of the different print sheets are checked, all proof pages are ready to be sent to the proofer to produce the proof sheets. These pages are arranged together in the right order for proofing in the proofer data. Without deviating from the scope of the present invention, this proofer data may be in the form of one multipage proofer output file, which contains multiple pages in a single file, or a single page proofer output file for each proofer page, which only contains one page per file, or several multipage proofer output files, each containing multiple pages in a single file.

It should be noted again that in the preferred embodiment, proofer data 811, in the form of one or more proofer output files comprise references to the location of page pairs in printing data 801, and positioning information in the form of the location and orientation of proofer page masks on each side of each sheet of printing data 801. In the preferred embodiment of the present invention, both the printing data 801 and proofer data 811 are in the GRS format, which is a variant of the GRO format, invented by Barco Graphics, the assignee of the present invention. GRO is short for GRaphic Output. A page description language such as PostScript® (from Adobe Systems, Inc.) could also be used. Indeed, simple conversions between GRO or GRS and other popular formats such as PostScript exist. GRO and GRS formats are more efficient to use than PostScript since they are compiled rather than interpreted. A GRS file consists of a header and data parts. One feature of GRO and GRS is good random access in that one can jump immediately to a certain page or internal image. A GRO or GRS file can make a reference to another GRO file, or to an image file such as one in the common TIFF format, and put a clipping mask on it. This clipping feature is used in Impose! and in the preferred embodiment of the present invention. How to implement a clipping mask in the proofer data for alternate embodiments that use formats other than GRO or GRS for the proofer data would be clear to those of ordinary skill in the art.

Figure 5:
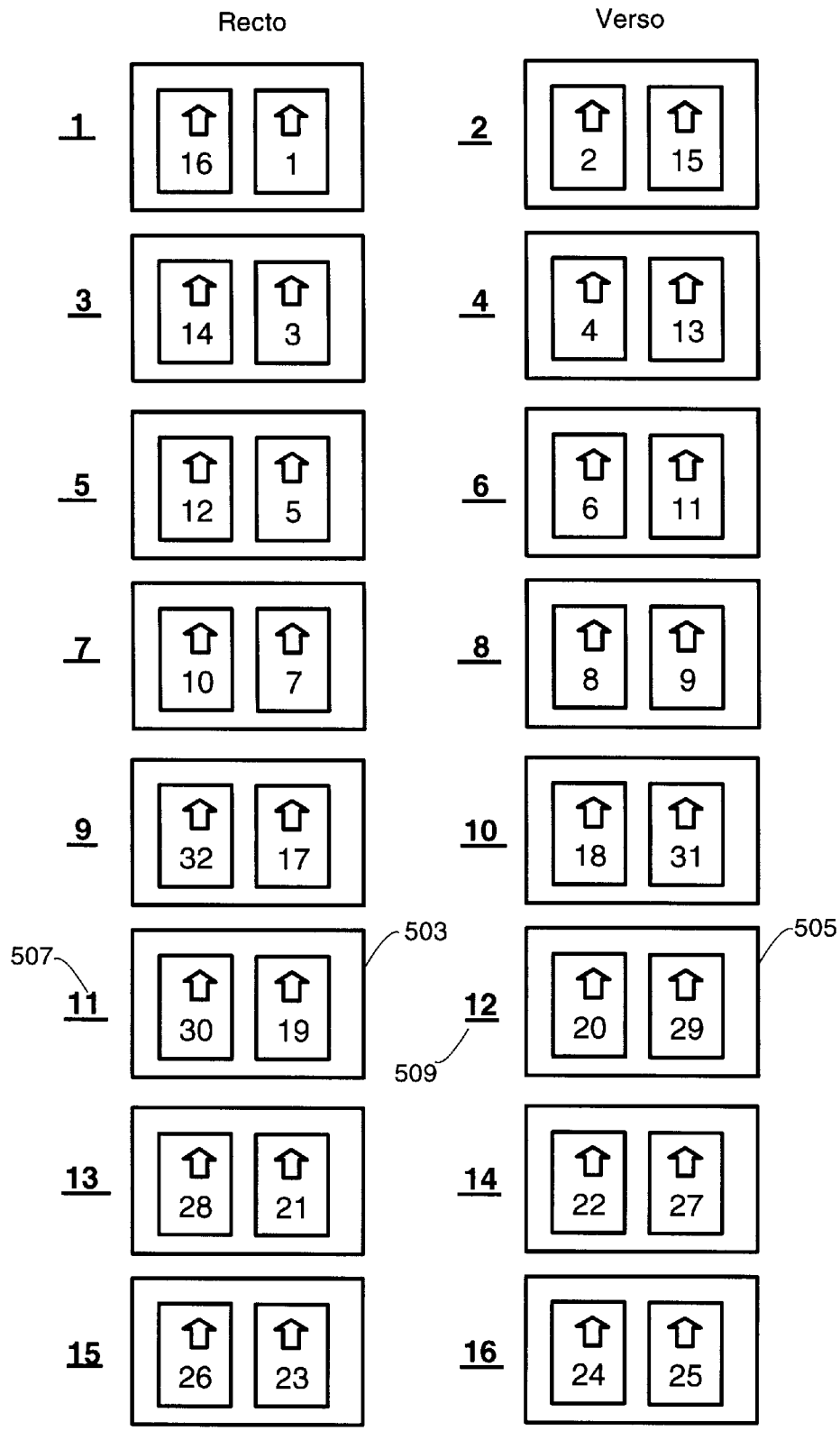
FIG. 5 shows, as an example, the different sides of proof sheets each containing two pages.

The resulting files of proofer data 811 obtained in this way preferably are sent to a recto verso proofer. This provides, for the example of the sample magazine, eight proof sheets with four pages printed on each sheet, two pages on the recto side and two pages on the verso side. FIG. 5 shows these proof sheets, with the value of proofside shown underlined to the left of each side of each proof sheet. For example, the sixth proof sheet consists of recto side 503 and verso side 505, having proofside values 11 and 12, respectively, these proofside values shown by underlined numbers 507 and 509 respectively.

Once the proof pages are printed, the first four proof sheets are collated, and the resulting pile of proof sheets, containing the first section, is folded in the middle. The last four proof sheets are collated and the resulting pile, containing the second section, is folded in the middle. When the two sections are collated, they serve as model for the printed magazine.

According to a preferred embodiment of the present invention, extra marks are added in step 809 to the data of the proofer output file. These extra marks are to aid checking for correct placement and for version control. In different embodiments, the identification marks include one or more of
    the name of the page,
    the date of proofing,
    a rectangle around the unfinished format,
    a rectangle around the finished format, and
    a rectangle around the text area of the page.

There is a still a small risk with the above described embodiment of the present invention that one can overwrite or change by mistake the images or pages or sheets after they are proofed, but before they are imaged as imposed sheets for final printing. In such a case, the printed book would not match the proof. One improved embodiment includes locking. Another includes versioning.

Yet another embodiment of marking step 809 avoids the complications and additional difficulty-of-use that locking or versioning introduces. In such an embodiment, step 809 comprises adding a "magic number" during output. This magic number is a function of the images, pages and sheets actually used to make the proof, in the case of proofing, and actually used to output the printing data, in the case of preparing the film or plate. The number is placed in the proofing pages and in the printing data output (the film or plate). The function is chosen so that if the magic number on the film or plate is the same as on the proof, there is an extremely high likelihood that these were made using the same data, and if the magic number on the film or plate does not match that on the proof, then there is certainty that the data used to proof is different from that used to prepare final output.

According to this embodiment, the method of the present invention calculates a magic number for a certain file (a proof file or print data file) based on:
    the characters of the file name,
    the characters of the file names of all the external references,
    the creation times of the file and the external references, and
    the number of blocks in the file and in its external references.

The creation date is not considered as it is not statistically meaningful enough. This method for determining the magic number provides a statistically small chance of synonyms, especially between visually similar proofs/films. Other mappings are possible within the scope of the present invention. The particular method used comprises:

adding up the chr values of the characters in the filename (minus 64 so that the chr for "A"=1) and converting the sum to base 36;

converting the creation time converted to seconds, and adding these up, then converting the sum to base 36; and adding up the block count of all the files and converting the sum to base 36.

Two options are offered, high precision and low precision. In the high precision version, all three numbers are returned and output on the proof and printer output sheets, separated by a slash. With low precision option, all three numbers are added and then converted to base 36, and this single number is printed. Because of rounding errors in the case of exponential figures, a counter is reset to 0 when it overflows (>999,999,999)

Figure 10:
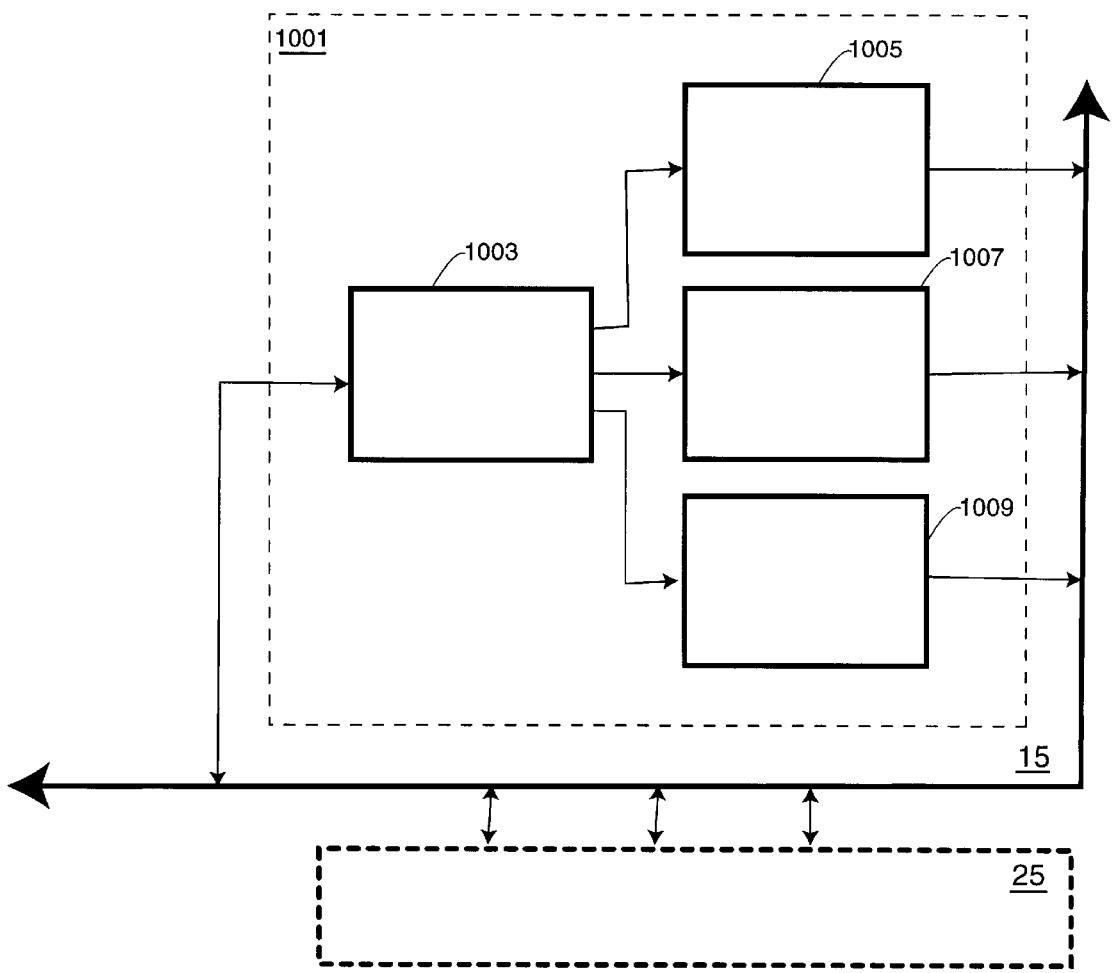
FIG. 10 shows an overview of the apparatus of the present invention.

An apparatus for performing imposition proofing is shown in FIG. 10. The apparatus, shown in box 1001, preferably is interfaced to bus subsystem 15 of computer system 10, through which it takes as input printing data 801 which preferably resides in one or more files in file system 25 of computer system 10. The output of the apparatus of the present invention generates proofer data 811, and preferably writes such data via bus subsystem 15 into one or more files which preferably are located in file system 25 of computer system 10.

The apparatus of the present invention comprises means 1003 for selecting from printing data 811 those pages positioned before the middle of each section. The apparatus also includes positioning means 1005 coupled to selecting means 1003, for positioning the selected pages together with their partner pages on a side of a proof page, and outputting that positioning information as part of proofer data 811. The apparatus also includes order determining means 1007 coupled to selecting means 1003, for the determining the logical place (the order) for the proof page side containing the selected page, and outputting the ordering information as part of proofer data 811. According to a preferred embodiment of the present invention, the apparatus also includes marking means 1009 coupled to selecting means 1003, for adding extra marks to the proofer data 811, these extra marks determined from the printing data 801 to aid checking for correct placement and for version control.

In the preferred embodiment of the apparatus, elements 1003, 1005, 1007 and 1009 are implemented in the form of computer program instructions operating on processor 12 of computer system 10. Missing from FIG. 10 therefore, are such details as the coupling and means for loading these computer program instructions to each of these elements, as well as overall control. How to include such details would be clear to those of ordinary skill in the art. In alternate embodiments, one or more of elements 1003, 1005, 1007 and 1009 may be implemented as special purpose hardware, incorporating for example, application specific integrated circuit devices ("ASIC") and/or digital signal processor ("DSP") devices. How to convert an implementation of elements as programs running on a computer system such as computer system 10 into special purpose hardware is well known in the art.

Although this invention has been described with respect to preferred embodiments, those embodiments are illustrative only. No limitation with respect to the preferred embodiments is intended or should be inferred. It will be observed that numerous variations and modifications may be effected without departing from the true spirit and scope of the novel concept of the invention, and it is intended that the scope of the invention be defined by the claims appended hereto.

What is claimed is:

1. A method for producing proofer data for printing sides of a set of proof sheets from printing data of a document, the document having one or more sections, each proof sheet having a recto side and a verso side, said printing data comprising printing information about printing a set of pages onto one or more print sheets and about the contents of the pages in the set of pages, and imposing information about how the set of pages are positioned on the print sheets, each print sheet including two print sheet sides, a verso print sheet side and a recto print sheet side, each print sheet side including at least four pages, each proof sheet comprising a printer spread of at most two pages, the method comprising:

for the pages of a particular section in a particular print sheet in said printing data, (a) choosing a first page of said particular section;

(b) for the chosen page, (i) determining if the chosen page is in the first half of the particular section, and if the chosen page is in the first half of the particular section, determining the printer spread which includes the chosen page and positioning the chosen page in the printer spread so that when the chosen page is head-up, the chosen page is located on the left of the one side of the proof sheet and the printer spread which includes the chosen page also includes the page immediately to the right of the chosen page in the printing data for the case of the one side of the proof sheet being the verso side and chosen page is located on the right of the one side of the proof sheet and the printer spread which includes the chosen page also includes the page immediately to the left of the chosen page in the printing data for the case of the one side of the proof sheet being the recto side, and determining the logical order of the proof side on which the chosen page is located;

(c) choosing a next page in the particular section and repeating step (b);

(d) repeating step (c) until all pages in the particular section have been chosen; and (e) repeating steps (a) through (d) for all sections until all pages in the printing data have been chosen.

2. The method of claim 1 wherein the corresponding proofer data generated in step (b)(ii) includes a logical order of the one side of the proof sheet in the set of proof sheets, said logical order including the ordering of the one side of the proof sheet in the set of proof sheets and whether the one side of the proof sheet is the recto side or the verso side.

3. The method of claim 2, further including repeating steps (a) and (b) for each section in the particular print sheet and for each print sheet in the printing data.

4. The method of claim 2 wherein said step (a) selects a page which is in the first half of the particular section.

5. The method of claim 2 wherein said step (a) selects a page which is in the second half of the particular section.

6. The method of claim 4 wherein said step (b)(ii) further includes:

determining extra marks from the printing data, the extra marks including aids for checking, the extra marks forming part of the corresponding proofer data.

7. The method of claim 6 wherein the printing data includes two formats, called the unfinished format and the finished format, respectively, and wherein the extra marks include one or more of the set which includes the name of one or more of the pages in the printer spread which includes the selected page, the date of generating the proofer data, a rectangle around the unfinished format which includes the printer spread which includes the selected page, a rectangle around the finished format which includes the printer spread which includes the selected page, and a rectangle around any text area of one or more of the pages in the printer spread which includes the selected page.

8. The method of claim 4 wherein said step (b)(ii) further includes:

determining extra marks from the printing data, the extra marks including aids for version control, the extra marks forming part of the corresponding proofer data; and adding at least a subset of the extra marks to the printing data.

9. The method of claim 8 wherein the printing information in the printing data includes references to the content of the pages in the printing data, and wherein the extra marks include a magic number, the magic number a function of the pages in, the sheets in, and the contents in the printing information of the printing data of the printer spread which includes the selected page, the function chosen so that if the magic number on any print sheets generated from the printing data is the same as on the corresponding proof sheets generated from the proofer data, there is an extremely high likelihood that the generated print sheets and the generated corresponding proof sheets were made using the same data, and if the magic number on any print sheets generated from the printing data is not the same as on the corresponding proof sheets generated from the proofer data, there is certainty that the generated print sheets and the generated corresponding proof sheets were made using different data.

10. The method of claim 4 wherein said step (b)(ii) includes orienting the printer spread which includes the selected page so that when the selected page is head-up the selected page is located on the left of the one side of the proof sheet for the case of the one side of the proof sheet being the verso side and on the right of the one side of the proof sheet for the case of the one side of the proof sheet being the recto side.

11. The method of claim 10 wherein each page in the set of pages has a logical page number and wherein said step (b) determines the one side of the proof sheet to be one of the verso side and the recto side depending on the parity of the page number of the selected page.

12. The method of claim 11 wherein the logical page numbers of the pages in the set of pages commence with logical page number one and wherein step (b) determines the one side of the proof sheet to be the verso side for the case of the selected page having an odd logical page number and to be the recto side for the case of the selected page having an even logical page number.

13. The method of claim 12 wherein said step (b) determines the ordering of the one side of the proof sheet to be the ordering that satisfies a relationship between the ordering, the logical page number of the selected page, and the number of pages in all sections previous to the section containing the selected page.

14. The method of claim 13 wherein the ordering of each side of the proof sheets is represented by a logical proof side number commencing with the first proof sheet in order having logical proof side number one, and wherein the relationship is that the logical proof side number of the one side of the proof sheet is equal to the logical page number of the selected page less one half of the number of pages in all sections previous to the section containing the selected page.

15. The method of claim 3 wherein each printer spread includes a spine location, the method further including
   (c) sending the proofer data to a proofer, the proofer generating printed sides of the proof sheets, the two printed sides of the same proof sheet forming a printed proof sheet;
   (d) folding the printed proof sheets at the spine location; and
   (e) collating the printed proof sheets to form at least one section of the document.

16. The method of claim 2 wherein the positioning data in the corresponding proofer data includes a reference to the printing information in the printing data.

17. The method of claim 16 wherein the reference includes a clipping mask acting on the printing information, said clipping mask defining a positioning outline of the printer spread which includes the selected page.

18. The method of claim 17 further including:
   (c) sending the proofer data to a proofer, the proofer generating printed sides of the proof sheets using the reference to the printing information to ensure that the same data is used to generate the print sides as is in the printing data containing the pages in said printed sides, the two printed sides of the same proof sheet forming a printed proof sheet.

19. A method for producing proofer data for printing sides of a set of proof sheets from printing data of a document, the document having one or more sections, each proof sheet having a recto side and a verso side, said printing data comprising printing information about printing a set of pages onto one or more print sheets and about the contents of the pages in the set of pages, and imposing information about how the set of pages are positioned on the print sheets, each print sheet including two print sheet sides, a verso print sheet side and a recto print sheet side, each print sheet side including at least four pages, each proof sheet comprising a printer spread of at most two pages, the method comprising:
   for the pages of a particular section in a particular print sheet in said printing data,
   (a) choosing a first page of said particular section;
   (b) for the chosen page,
      (i) determining if the chosen page is in the first half of the particular section, and if the chosen page is in the first half of the particular section,
         determining the printer spread which includes the chosen page and positioning the chosen page in the printer spread so that when the chosen page is head-up, the chosen page is located on the left of the one side of the proof sheet and the printer spread which includes the chosen page also includes the page immediately to the right of the chosen page in the printing data for the case of the one side of the proof sheet being the verso side and chosen page is located on the right of the one side of the proof sheet and the printer spread which includes the chosen page also includes the page immediately to the left of the chosen page in the printing data for the case of the one side of the proof sheet being the recto side, and
         determining the logical order of the proof side on which the chosen page is located;
   (c) choosing a next page in the particular section and repeating step (b);
   (d) repeating step (a) until all pages in the particular section have been chosen; and
   (e) repeating step (b) until all pages in the printing data have been chosen.

20. An apparatus for producing proofer data for printing sides of a set of proof sheets from printing data of a document, the document having one or more sections, each proof sheet having a recto side and a verso side, said printing data comprising printing information about printing a set of pages onto one or more print sheets and about contents of the pages in the set of pages, and imposing information about how the set of pages are positioned on the print sheets, each print sheet including two print sheet sides, a verso print sheet side and a recto print sheet side, each print sheet side including at least four pages, each proof sheet comprising a printer spread of at most two pages, the apparatus having a central processor unit (CPU), a memory, and a file system containing the printing data, the apparatus comprising:
   (a) selection means using the CPU and the memory, configured to select a page in a particular section of the printing data; and
   (b) positioning means, using said CPU and the memory, configured to determine the printer spread which includes the selected page and to generate proofer data corresponding to the selected page, the corresponding proofer data including positioning information for positioning and printing the printer spread which includes the selected page on one side of a proof sheet of the set of proof sheets.

21. The apparatus of claim 20 further including: (c) order determining means, using said CPU and the memory, configured to determine a logical order of the one side of the proof sheet in the set of proof sheets and to include the logical order as part of the corresponding proofer data, the logical order including the ordering of the one side of the proof sheet in the set of proof sheets and whether the one side of the proof sheet is the recto side or the verso side.

22. The apparatus of claim 21 wherein said selection means is configured to select a page which is in the first half of the particular section.

23. The apparatus of claim 21 wherein said selection means is configured to select a page which is in the second half of the particular section.

24. The apparatus of claim 22 further including:
   (d) marking means, using the CPU and the memory, configured to add extra marks from the printing data into the proofer data, the extra marks including aids for checking.

25. The apparatus of claim 24 wherein the printing data includes two formats, called the unfinished format and the finished format, respectively, and wherein the extra marks include one or more of the set which includes the name of one or more of the pages in the printer spread which includes the selected page, the date of generating the proofer data, a rectangle around the unfinished format which includes the printer spread which includes the selected page, a rectangle around the finished format which includes the printer spread which includes the selected page, and a rectangle around any text area of one or more of the pages in the printer spread which includes the selected page.

26. The apparatus of claim 22 further including:
   (d) marking means, using the CPU and the memory, configured to add extra marks determined from the printing data, into the proofer data and into the printing data, the extra marks including aids for version control.

27. The apparatus of claim 26 wherein the printing information in the printing data includes references to the content of the pages in the printing data, and wherein the extra marks include a magic number, the magic number a function of the pages in, the sheets in, and the contents in the printing information of the printing data of the printer spread which includes the selected page, the function chosen so that if the magic number on any print sheets generated from the printing data is the same as on the corresponding proof sheets generated from the proofer data, there is an extremely high likelihood that the generated print sheets and the generated corresponding proof sheets were made using the same data, and if the magic number on any print sheets generated from the printing data is not the same as on the corresponding proof sheets generated from the proofer data, there is certainty that the generated print sheets and the generated corresponding proof sheets were made using different data.

28. The apparatus of claim 22 wherein the positioning means also is configured to orient the printer spread which includes the selected page so that when the selected page is head-up the selected page is located on the left of the one side of the proof sheet for the case of the one side of the proof sheet being the verso side and on the right of the one side of the proof sheet for the case of the one side of the proof sheet being the recto side.

29. The apparatus of claim 28 wherein each page in the set of pages has a logical page number and wherein the positioning means also is configured to determine the one side of the proof sheet to be one of the verso side and the recto side depending on the parity of the page number of the selected page.

30. The apparatus of claim 29 wherein the logical page numbers of the pages in the set of pages commence with logical page number one and wherein the positioning means also is configured to determine the one side of the proof sheet to be the verso side for the case of the selected page having an odd logical page number and to be the recto side for the case of the selected page having an even logical page number.

31. The apparatus of claim 30 wherein the order determining means is configured to determine the ordering of the one side of the proof sheet to be the ordering that satisfies a relationship between the ordering, the logical page number of the selected page, and the number of pages in all sections previous to the section containing the selected page.

32. The apparatus of claim 31 wherein the ordering of each side of the proof sheets is represented by a logical proof side number commencing with the first proof sheet in order having logical proof side number one, and wherein the relationship is that the logical proof side number of the one side of the proof sheet is equal to the logical page number of the selected page less one half of the number of pages in all sections previous to the section containing the selected page.

33. The apparatus of claim 22 further including
   (d) a proofer coupled to said positioning means and capable of receiving the proofer data.

34. The apparatus of claim 21 wherein the positioning data in the corresponding proofer data includes a reference to the printing information in the printing data.

35. The apparatus of claim 34 wherein the reference includes a clipping mask acting on the printing information, said clipping mask defining a positioning outline of the printer spread which includes the selected page.

36. A computer software product comprising:
   computer readable storage medium with computer readable code embodied therein for causing a computer to produce proofer data for printing sides of a set of proof sheets from printing data of a document, the document having one or more sections, each proof sheet having a recto side and a verso side, said printing data comprising printing information about printing a set of pages onto one or more print sheets and about the contents of the pages in the set of pages, and imposing information about how the set of pages are positioned on the print sheets, each print sheet including two print sheet sides, a verso print sheet side and a recto print sheet side, each print sheet side including at least four pages, each proof sheet comprising a printer spread of at most two pages, and wherein the computer readable code comprises:
   (a) computer readable program code devices configured to cause said computer to affect a selection mechanism configured to select a page in a particular section of the printing data; and
   (b) computer readable program code devices configured to cause said computer to affect a positioning mechanism configured to determine the printer spread which includes the selected page and to generate proofer data corresponding to the selected page, the corresponding proofer data including positioning information for positioning and printing the printer spread which includes the selected page on one side of a proof sheet of the set of proof sheets.

37. The computer software product of claim 36 wherein the computer readable code further comprises:
   (c) computer readable program code devices configured to cause said computer to affect an order determining mechanism configured to determine a logical order of the one side of the proof sheet in the set of proof sheets and to include the logical order as part of the corresponding proofer data, the logical order including the ordering of the one side of the proof sheet in the set of proof sheets and whether the one side of the proof sheet is the recto side or the verso side.

38. The computer software product of claim 37 wherein said selection mechanism is configured to select a page which is in the first half of the particular section.

39. The computer software product of claim 37 wherein said selection mechanism is configured to select a page which is in the second half of the particular section.

40. The computer software product of claim 38 wherein the computer readable code further comprises:
   (d) computer readable program code devices configured to cause said computer to affect a marking mechanism configured to add extra marks from the printing data into the proofer data, the extra marks including aids for checking.

41. The computer software product of claim 40 wherein the printing data includes two formats, called the unfinished format and the finished format, respectively, and wherein the extra marks include one or more of the set which includes the name of one or more of the pages in the printer spread which includes the selected page, the date of generating the proofer data, a rectangle around the unfinished format which includes the printer spread which includes the selected page, a rectangle around the finished format which includes the printer spread which includes the selected page, and a rectangle around any text area of one or more of the pages in the printer spread which includes the selected page.

42. The computer software product of claim 38 wherein the computer readable code further comprises:
   (d) computer readable program code devices configured to cause said computer to affect a marking mechanism configured to add extra marks determined from the printing data into the proofer data and into the printing data, the extra marks including aids for version control.

43. The computer software product of claim 42 wherein the printing information in the printing data includes references to the content of the pages in the printing data, and wherein the extra marks include a magic number, the magic number a function of the pages in, the sheets in, and the contents in the printing information of the printing data of the printer spread which includes the selected page, the function chosen so that if the magic number on any print sheets generated from the printing data is the same as on the corresponding proof sheets generated from the proofer data, there is an extremely high likelihood that the generated print sheets and the generated corresponding proof sheets were made using the same data, and if the magic number on any print sheets generated from the printing data is not the same as on the corresponding proof sheets generated from the proofer data, there is certainty that the generated print sheets and the generated corresponding proof sheets were made using different data.

44. The computer software product of claim 38 wherein the positioning mechanism also is configured to orient the printer spread which includes the selected page so that when the selected page is head-up the selected page is located on the left of the one side of the proof sheet for the case of the one side of the proof sheet being the verso side and on the right of the one side of the proof sheet for the case of the one side of the proof sheet being the recto side.

45. The computer software product of claim 44 wherein each page in the set of pages has a logical page number and wherein the positioning mechanism also is configured to determine the one side of the proof sheet to be one of the verso side and the recto side depending on the parity of the page number of the selected page.

46. The computer software product of claim 45 wherein the logical page numbers of the pages in the set of pages commence with logical page number one and wherein the positioning mechanism also is configured to determine the one side of the proof sheet to be the verso side for the case of the selected page having an odd logical page number and to be the recto side for the case of the selected page having an even logical page number.

47. The computer software product of claim 46 wherein the order determining mechanism is configured to determine the ordering of the one side of the proof sheet to be the ordering that satisfies a relationship between the ordering, the logical page number of the selected page, and the number of pages in all sections previous to the section containing the selected page.

48. The computer software product of claim 47 wherein the ordering of each side of the proof sheets is represented by a logical proof side number commencing with the first proof sheet in order having logical proof side number one, and wherein the relationship is that the logical proof side number of the one side of the proof sheet is equal to the logical page number of the selected page less one half of the number of pages in all sections previous to the section containing the selected page.

49. The computer software product of claim 37 wherein the positioning data in the corresponding proofer data includes a reference to the printing information in the printing data.

50. The computer software product of claim 40 wherein the reference includes a clipping mask acting on the printing information, said clipping mask defining a positioning outline of the printer spread which includes the selected page.

* * * * *

UNITED STATES PATENT AND TRADEMARK OFFICE
CERTIFICATE OF CORRECTION

PATENT NO : 5,995,719

DATED : November 30, 1999

INVENTOR(S): Bourdeaud'hui, et al.

It is certified that an error appears in the above-identified patent and that said Letters Patent are hereby corrected as shown below:

On the front page top header, below "UNITED STATED PATENT" replace the inventor name from "Bourdead'hui et al." to —Bourdeaud'hui et al.—

On the front page, after "Inventors" replace the name of the first inventor from "Antoine Bourdead'hui" to —Antoine Bourdeaud'hui—

Signed and Sealed this

Twenty-fourth Day of October, 2000

*Attest:*

Q. TODD DICKINSON

*Attesting Officer*      *Director of Patents and Trademarks*